United States Patent
Shan et al.

(10) Patent No.: US 6,187,667 B1
(45) Date of Patent: Feb. 13, 2001

(54) METHOD OF FORMING METAL LAYER(S) AND/OR ANTIREFLECTIVE COATING LAYER(S) ON AN INTEGRATED CIRCUIT

(75) Inventors: Ende Shan, San Ramon; Gorley Lau, Fremont; Sam G. Geha, Sunnyvale, all of CA (US)

(73) Assignee: Cypress Semiconductor Corp., San Jose, CA (US)

( * ) Notice: Under 35 U.S.C. 154(b), the term of this patent shall be extended for 0 days.

(21) Appl. No.: 09/099,655

(22) Filed: Jun. 17, 1998

(51) Int. Cl.$^7$ .................................................. H01L 21/477
(52) U.S. Cl. ......................... 438/636; 438/648; 438/656; 438/660; 438/692; 438/646; 438/710
(58) Field of Search .................... 438/636, 692, 438/646, 720; 257/751

(56) References Cited

U.S. PATENT DOCUMENTS

| | | |
|---|---|---|
| 4,267,012 | 5/1981 | Pierce et al. . |
| 4,656,732 | 4/1987 | Teng et al. . |
| 4,711,701 | 12/1987 | McLevige . |
| 4,902,377 | 2/1990 | Berglund et al. . |
| 4,933,304 * | 6/1990 | Chen et al. ............................ 437/194 |
| 4,962,060 | 10/1990 | Sliwa et al. . |
| 4,970,176 * | 11/1990 | Tracy et al. ............................ 437/187 |
| 5,066,615 * | 11/1991 | Brady et al. ........................... 437/229 |
| 5,108,570 | 4/1992 | Wang . |
| 5,225,040 | 7/1993 | Rohner . |
| 5,288,665 | 2/1994 | Nulman . |
| 5,443,995 | 8/1995 | Nulman . |
| 5,665,659 * | 9/1997 | Lee et al. .............................. 438/646 |
| 5,807,760 * | 9/1999 | Buckfeller et al. ................... 437/187 |
| 5,939,788 * | 8/1999 | McTeer ................................. 257/751 |
| 5,990,011 * | 11/1999 | McTeer ................................. 438/692 |
| 5,994,217 * | 11/1999 | Ng ......................................... 438/636 |
| 6,090,443 * | 7/2000 | Eastep .............................. 427/255.32 |

* cited by examiner

Primary Examiner—Matthew S. Smith
Assistant Examiner—V. Yevsikov
(74) Attorney, Agent, or Firm—Brinks Hofer Gilson & Lione

(57) ABSTRACT

A method of forming metallic layers on a substrate includes the steps of forming a first layer including a first metal on the substrate; cooling the first layer for a period of time sufficient to suppress formation of an intermetallic phase; and forming a second layer including a second metal distinct from the first metal on the first layer. The cooling step decreases the roughness of the resultant stacked structure by suppressing the formation of an intermetallic phase layer between the two metallic layers and by suppressing "bumps" or other surface irregularities that may form at relatively reactive grain boundaries in the first layer.

19 Claims, 2 Drawing Sheets

US 6,187,667 B1

METHOD OF FORMING METAL LAYER(S) AND/OR ANTIREFLECTIVE COATING LAYER(S) ON AN INTEGRATED CIRCUIT

BACKGROUND OF THE INVENTION

1. Field of the Invention

This invention relates to the formation of a layer of metal on a substrate and, in particular, to the formation of an anti-reflective coating (ARC) and/or ARC-containing layer that has a reduced roughness. More particularly, the present invention relates to the formation of a titanium- and/or tungsten-containing ARC layer on an aluminum- or aluminum alloy-containing metallization layer in an integrated circuit.

2. Description of the Related Art

Some metal deposition processes result in formation of grain boundaries in the deposited metal layer. Such grain boundaries may give rise to localized sites of high reactivity in the metal layer.

In particular, in integrated circuit fabrication, aluminum tends to be somewhat reactive with subsequently deposited titanium-tungsten alloy, particularly when the substrate is at a relatively high temperature (e.g., 480° C.). This often results in localized formation of a TiWAl phase at the aluminum grain boundaries, causing formation of TiWAl "bumps" on the surface of the deposited aluminum layer. FIG. 1 is a cross-sectional representation of one such TiWAl "bump" at a grain boundary, as formed using a conventional process. As shown therein, numeral 110 references a grain boundary of a metallization layer 105, such as aluminum. As the ARC layer, such as TiW, is conventionally formed at high temperatures, deposition of a TiW layer 130 on the metallization layer 105 causes an underlying intermetallic phase 120 of TiWAl to be formed. Such an intermetallic phase 120 of TiWAl tends to form one or more "bumps" 140 above the reactive grain boundary. Because of these "bumps" 140 of intermetallic phase TiWAl 120, the overlying ARC layer 130 of TiW exhibits one or more corresponding "bumps" 150. These "bumps" 150 increase the surface roughness of the aluminum layer 105, causing problems during subsequent photolithography and metal etching processes. In the worst case, the "bumps" 140, 150 may be sufficiently large to adversely affect the yield of the metallization process and/or of the entire integrated circuit fabrication process.

It is, therefore, desirable to provide a method of forming an anti-reflective coating (ARC) and/or ARC-containing metal layer on a substrate that reduces the roughness of the coating or layer. More particularly, it is desirable to provide a method of forming a titanium- and/or tungsten-containing ARC layer on an aluminum- or aluminum alloy-containing metal layer in an integrated circuit, where the ARC layer may have a relatively uniform thickness and/or where the metal layer containing the ARC layer has a reduced roughness relative to similar metal layers formed by conventional processes.

SUMMARY OF THE INVENTION

It is, therefore, an object of the present invention to provide a method of forming an anti-reflective coating (ARC) and/or ARC-containing metal layer on a substrate that reduces the roughness of the coating or layer. More particularly, it is an object of the present invention to provide a method of forming a titanium- and/or tungsten-containing ARC layer on an aluminum- or aluminum alloy-containing metal layer in an integrated circuit, where the ARC layer may have a relatively uniform thickness and/or where the metal layer containing the ARC layer has a reduced roughness relative to similar metal layers formed by conventional processes.

In accordance with the above-described objects and those that will be mentioned and will become apparent below, a method of forming metallic layers on a substrate, according to an embodiment of the present invention, comprises the steps of:

forming a first layer comprising a first metal on the substrate;

cooling the first layer for a period of time sufficient to suppress formation of an intermetallic phase; and forming a second layer comprising a second metal distinct from said first metal on the first layer.

According to further preferred embodiments, the first layer forming step may be preceded by a wetting layer forming step. The first layer may include one or more elements selected from the group consisting of aluminum, gold, silver, copper, indium, tantalum, molybdenum and tungsten. The first layer forming step may be carried out at a temperature of at least 350° C., preferably between about 350° C. and about 550° C. and more preferably between about 400° C. and about 500° C., and even more preferably between about 450° C. and about 480° C. The cooling step may be carried out for a period of time at least equal to 30 seconds. The cooling step may cool the first layer to about 300° C. or below and preferably to a temperature equal to or less than 250° C. The intermetallic phase may include at least one element from each of the first and second metallic layers. The second layer may include at least one refractory metal, which may include one or more elements selected from the group consisting of tungsten, nickel, molybdenum, tantalum and titanium. The cooling step may be carried out by flowing an inert gas near the first layer or the substrate, at a temperature effective to cool the first layer. The inert gas may be selected from the group consisting of nitrogen, helium and argon and may be flowed at a flow rate selected within a range of from about 35 sccm to about 65 sccm.

According to another embodiment, a method of reducing a surface roughness of a stacked structure including at least a first and a second metal layer comprises the steps of:

depositing the first metal layer at a first temperature;

cooling the first metal layer to a second temperature that is less than the first temperature, the second temperature being effective to suppress formation of an intermediate layer between the first and second metal layers that includes at least one element from the first metal layer and at least one element from the second metal layer; and depositing the second metal layer.

According to still further embodiments, the first temperature may be at least equal to about 350° C. and the second temperature may be equal to or lower than about 300° C. The first metal layer may include aluminum and the second metal layer may include titanium and/or tungsten. The first metal layer may be deposited in a process chamber at a first power level and the cooling step may be carried out at a second power level that may be less than the first power level. The second power level may be substantially equal to zero.

According to another preferred embodiment, a stacked structure including at least a metallization layer and an overlying anti-reflective coating may be produced by carrying out the steps of depositing the metallization layer on a substrate; cooling the metallization layer for at least 30 seconds; and depositing the anti-reflective coating on the cooled metallization layer. The metallization layer may include one or more metals suitable to form an electrical interconnect and the anti-reflective layer may include one or more refractory metals.

BRIEF DESCRIPTION OF THE DRAWINGS

For a further understanding of the objects and advantages of the present invention reference should be made to the following detailed description, taken in conjunction with the accompanying figures, in which.

DESCRIPTION OF THE PREFERRED EMBODIMENTS

Figure 1:
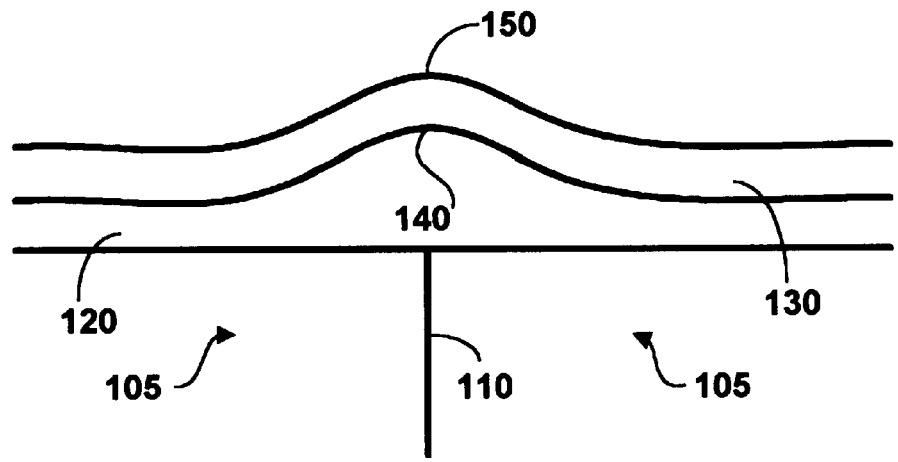
FIG. 1 is a cross-sectional representation of the surface roughness of an ARC layer across again boundary of a metal layer, as formed using conventional processes.
Figure 2:
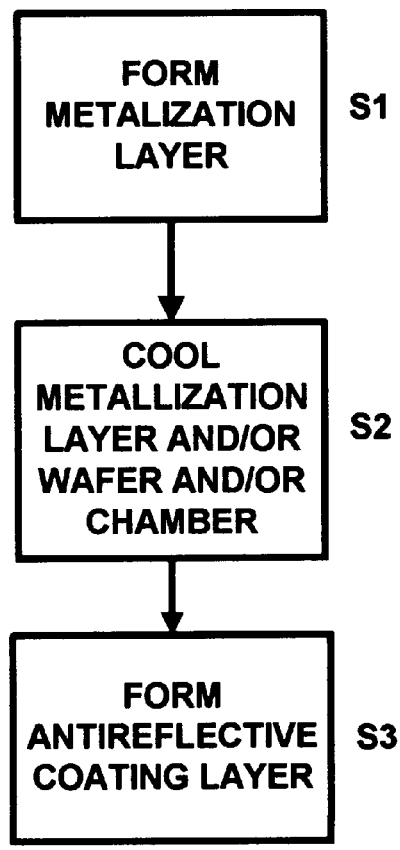
FIG. 2 is a flow chart illustrating an embodiment of the present invention.

An embodiment of the method according to the present invention present invention is shown at FIG. 2. According to the present invention, a first layer including a first metal (hereafter the metallization layer) is formed (e.g., by deposition) at step S1. Within the context of semiconductor devices, the metallization layer may include aluminum or an alloy thereof formed (by, for example, deposition) on a semiconductor wafer. To increase the uniformity and the degree of adhesion of the metallic layer deposited on the semiconductor wafer, a wetting layer may be deposited on the substrate at high temperature, using the method described in commonly assigned U.S. co-pending application, Ser. No. 08/740,290, entitled "Method Of Forming A Metal Layer On A Substrate, Including Formation Of Wetting Layer At High Temperature" by Sam G. Geha and Ende Shan, filed Oct. 25, 1996, the disclosure of which is incorporated herewith in its entirety. To prevent migration of silicon atoms into the metallization layer, a barrier layer of, for example, a titanium-tungsten alloy or silicon nitride may be deposited between the substrate and the metallization layer. A suitable process for forming a metallization layer of aluminum on a semiconductor substrate is disclosed in commonly assigned U.S. co-pending application, Ser. No. 08/693,978 entitled "Improved Hot Metallization Process" by Sam G. Geha, filed Aug. 1, 1996, the disclosure of which is also incorporated herewith in its entirety. Herein, a "metallization layer" refers to a layer of metal on a substrate, without regard to the relative magnitudes of the dimensions of the metal formation (i.e., the term "metal layer" or "metallization layer" is not intended to be restricted by the connotation associated with the word "layer"). For example, in a semiconductor device, a metal layer may include, for example, an electrically conductive trace formed of a metal, an electrically conductive ground or power plane formed of metal, or an electrically conductive contact (i.e., a filled via) formed of metal. The metallization layer may be formed by any conventional process, such as by sputtering, plasma and/or deposition by a chemical vapor deposition technique.

Other metallization layers may also be used within the context of the present invention. For example, tungsten may be formed (e.g. deposited) as the primary metal material (i.e., as the metallization layer), from $WF_6$. Tungsten, for example, may also be used instead of aluminum as a metallization layer on a semiconductor wafer as tungsten may be better able to fill in vias having a high aspect ratio.

In step S2, the metallization layer formed in step S1 is cooled. This may be done by cooling the metallization layer and/or the wafer in the process chamber and/or by cooling the entire process chamber. The length of time the cooling step S2 is carried out is generally for a period of time sufficient to suppress the subsequent formation of intermetallic species on the metallization layer upon formation of a second layer including a second metal distinct from the first metal, such as an antireflective coating (ARC) layer or other metal layer. For example, cooling the metallization layer deposited in step S1 for a period of time ranging from about 15 seconds to about 90 seconds suppresses the formation of an intermetallic phase layer. More preferably, the cooling period ranges from about 30 seconds to about 60 seconds. For example, the cooling of the metallization layer may be carried out for a period of about 45 seconds, to effectively suppress the formation of intermetallic compounds such as TiWAl, for example, when Al is used as the metallization layer and TiW is used as the ARC layer.

To cool the metallization layer and/or the wafer and/or the process chamber, an inert gas (such as, for example, nitrogen, helium or argon) at a temperature lower than the desired, target and/or effective temperature of the cooling step (e.g., room or ambient temperature) may be introduced into the process chamber and/or impinged onto the metallization layer and/or directed against the backside of the wafer as the wafer is supported in the process chamber by a mechanical or electrostatic chuck. The flow rate of the inert gas may be selected within a range of about 15 to about 65 sccm. More preferably, the flow rate of the cooling gas may be selected within the range of about 20 to 60 sccm. For example, the flow rate of the cooling gas, such as argon, may be about 45 sccm for a period of about 45 seconds. According to the present invention, the RF power within the process chamber is preferably turned off during the cooling step S2.

When aluminum is used as the metallization layer, the final deposition temperature may be relatively high, such as about 450° C. to about 550° C., although the initial deposition temperature thereof may be lower when the aluminum metallization layer is deposited in a multi-stage process. Such high final temperatures are desirable, as the atomic mobility of the metal atoms increases with increasing temperature. High atomic mobility is important to ensure good step coverage, to properly fill high aspect ratio vias and trenches, as well as to ensure the deposition of a homogeneous, smooth and dense metal layer substantially free of voids and other irregularities.

When a TiW ARC layer is deposited over an aluminum metallization layer according to conventional processes, however, an undesirable phase and/or layer of $Ti_xW_yAl_z$ may form between the TiW and Al layers and create one or more "bumps" at the grain boundaries of the Al layer. According to the present invention, however, the step of cooling the metallization layer, the wafer and/or the process chamber suppresses or at least inhibits the formation of intermetallic phases (such as the ternary compound $Ti_xW_yAl_z$) and greatly reduces the height of any "bumps" that may form at the metallization layer grain boundaries. Such cooling is preferably carried out for a period of time sufficient to suppress the formation of such intermetallic phases.

In terms of temperature, for example, the cooling of the metallization layer prior to the ARC layer or coating formation may be carried out until the metallization layer reaches a temperature of about 300° C. or below. Preferably, the metallization layer is cooled to a temperature of about 275° C. or below. More preferably, the metalization layer is cooled to a temperature less than or equal to about 250° C. It should be noted that the temperature to which the metallization layer is to be cooled, as well as the period of time during which the metallization layer is to be cooled will vary depending upon the application at hand. Factors that affect the cooling times and the desired cooling temperature include the composition, topography and thickness of the metallization layer, the temperature at which the metallization layer is formed or deposited, the pressure within the process chamber and the thermal conductivity characteristics of the metallization layer, among other factors. Thus, the period of time during which the metallization layer is to be cooled and/or the temperature to which the metallization layer is to be cooled will vary depending upon the application envisaged, and all such variations are to be included within the scope of the present invention.

Thereafter, as shown in step S3, an ARC layer or coating, such as TiW, is formed (e.g. deposited) on the cooled metallization layer. Other ARC layers include, for example, titanium nitride (TiN), tantalum nitride (TaN), indium tin oxide (InTO), zirconium (Zr), aluminum nitride (AlN), silicon nitride ($Si_3N_4$), amorphous carbon, etc. Forming an ARC layer or coating on a cooled metallization layer substantially decreases the surface roughness of the resultant ARC layer, as compared to conventional processes. For example, TiW may be formed for 5 to 13 seconds, depending on the film thickness, to form an ARC layer, while an inert gas, such as argon, is flowed into the process chamber at a flow rate of about 45 sccm while the applied power within the process chamber is about 1500–4000 watts DC.

Figure 3:
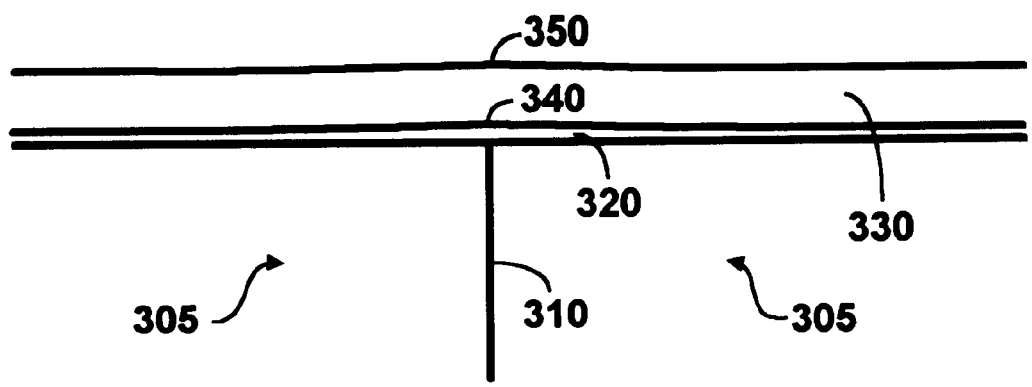
FIG. 3 is a cross-sectional representation of the highly uniform (e.g., smooth) surface of an ARC layer across a grain boundary of a metal layer, as formed according to an embodiment of the method of the present invention.

FIG. 3 illustrates a cross-sectional representation of a highly smooth (i.e., low roughness) surface of a second layer or coating across a grain boundary of an underlying first layer, as formed according to an embodiment of the method of the present invention. Reference numeral 310 represents a grain boundary between grains of a first layer 305. The first layer 305 may be a metallization layer of, for example, aluminum. When the underlying metallization layer 305 is cooled as described relative to FIG. 2 prior to the formation (by, for example, deposition) of an ARC layer 330, the formation of an intermetallic phase 320 is eliminated, greatly suppressed or at least inhibited. Moreover, the size (e.g. height above the surface of the metallization layer 305) of the "bumps" 340, 350 of the intermetallic phase 320 and the ARC layer 330, respectively is also advantageously reduced, resulting in a substantially smoother surface than was conventionally possible using previous techniques. The intermetallic "bump" thickness, as well as the intermetallic layer thickness is preferably at least 30% less than, more preferably at least 50% less than and most preferably at least 70% less than the corresponding thickness of an otherwise identical intermetallic "bump" and/or intermetallic layer formed at a temperature of at least 350° C., preferably between 350° C. and 550° C. and more preferably between 400° C. and 500° C., and even more preferably between 450° C. and 480° C. The "bump" thickness may be measured at the grain boundary of the metalization layer. The ARC layer 330, according to the present invention, may include TiW or an alloy thereof or most any metal or metal alloy. For example, the ARC 330 layer may be a 1:1 molar alloy of TiW, where the ratio of Ti to W is about 10% to about 90% by weight, respectively.

It is to be understood that the present invention also finds utility in applications wherein the metallization layer is other than aluminum and the ARC layer is other than TiW. In general, the metallization layer should have good electrical conductivity characteristics. For example, a metallization layer including tungsten, silver, copper gold, indium, tantalum, molybdenum or other conductive metal(s) may be formed. Likewise, Ti alone, W alone or different alloys of Ti and/or W may be utilized within the context of the present invention, with good results. Generally, the present invention is believed to be useful in increasing surface smoothness of metallization layers by suppressing the formation of an intermetallic phase and decreasing the magnitude of "bumps" at the reactive grain boundaries. For example, ARC layers of any refractory metal(s) or compounds thereof having anti-reflective properties may be advantageously formed on a cooled metallization layer, according to the present invention. For example, a suitable ARC layer for use within the method of the present invention may include, for example, one or more of the following elements: tungsten, nickel, molybdenum, tantalum and titanium.

Moreover, the present invention is not to be limited to stacked structures including a metallization layer and an ARC layer. Indeed, the present invention will, it is believed, benefit most any metallic stacked structure wherein grain boundaries in an underlying layer cause undesired surface roughness in an overlying layer. In general, the present invention finds beneficial application whenever a first metal layer is deposited prior to the formation or deposition of a second, distinct metal layer on a substrate, such as an integrated circuit wafer. The deposition of such a first metal layer may produce grain boundaries which may be relatively more reactive than the area between the grain boundaries. Such regions of relatively greater reactivity may induce surface roughness, "bumps", voids and other material defects within the second layer. Cooling the first metal layer prior to the deposition of the second layer according to the present invention eliminates, suppresses or at least inhibits the formation of an intermetallic phase that includes constituent elements of both the first and the second layer.

This suppression or inhibition of an intermetallic phase results in a second layer having increased uniformity and smoothness. In the case of semiconductor wafers, such smoothness is beneficial in terms of increased yields and more precise lithography, especially as line widths migrate to ever-smaller dimensions, such as 0.25 microns, 0.18 microns and below. Indeed, in these cases, the dimensions of the "bumps" or other undesirable features may become a substantial percentage of the line width, with deleterious results. In other devices and/or processes, increased surface smoothness may have similar advantages, in terms of yield and/or increased utility.

The present invention may also be used to form metal layers in active electronic components (e.g. integrated circuit chips, transistors and diodes) and passive components (e.g. resistors, capacitors and inductors). The present invention may also be used to form stacked metal layers in other types of devices, such as lead frames, medical devices and flat panel displays, or any device or structure that would benefit from smooth surfaces on layers having and/or interfacing with (underlying) materials having at grain boundaries.

While the foregoing detailed description has described preferred embodiments of the present invention, it is to be understood that the above description is illustrative only and not limiting of the disclosed invention. For example, other steps may be implemented after the metallization layer deposition step but before deposition of the ARC or other layer. Moreover, metallic layers or coatings other than anti-reflective coatings may be deposited on the metallization layer and the teachings of the present invention may be advantageously applied to such layers or coatings. Thus, the present invention to be limited only by the claims as set forth below.

What is claimed is:

1. A method of forming metallic layers on a substrate, comprising the steps of:
   forming a first layer comprising a first metal on the substrate;
   cooling the first layer for a period of time sufficient to suppress formation of an intermetallic phase; and
   forming a second layer comprising a second metal distinct from said first metal on the first layer.

2. The method of claim 1, wherein the first layer forming step is preceded by a wetting layer forming step.

3. The method of claim 1, wherein the first layer includes at least one element selected from the group consisting of aluminum, gold, silver, copper, indium, tantalum, molybdenum and tungsten.

4. The method of claim 1, wherein the first layer forming step is carried out at a temperature of at least 350° C.

5. The method of claim 1, wherein the cooling step is carried out for a period of time at least equal to 30 seconds.

6. The method of claim 1, wherein the cooling step cools the first layer to about 300° C. or below.

7. The method of claim 1, wherein the intermetallic phase includes at least one element from each of the first and second metallic layers.

8. The method of claim 1, wherein the second layer includes at least one refractory metal.

9. The method of claim 8, wherein the second metallic layer includes at least one element selected from the group consisting of tungsten, nickel, molybdenum, tantalum and titanium.

10. The method of claim 1, wherein the cooling step is carried out by flowing an inert gas near the first layer or the substrate, at a temperature effective to cool the first layer.

11. The method of claim 10, wherein the cooling gas is selected from the group consisting of nitrogen, helium and argon.

12. The method of claim 10, wherein the inert gas is flowed at a flow rate selected within a range of from about 15 sccm to about 65 sccm.

13. Method of reducing a surface roughness of a stacked structure including at least a first and a second metal layer, comprising the steps of:
   depositing the first metal layer at a first temperature;
   cooling the first metal layer to a second temperature that is less than the first temperature, the second temperature being effective to suppress formation of an intermediate layer between the first and second metal layers that includes at least one element from the first metal layer and at least one element from the second metal layer; and
   depositing the second metal layer.

14. The method of claim 13, wherein the first temperature is at least equal to about 350° C. and the second temperature is equal to or lower than about 300° C.

15. The method of claim 13, wherein the first metal layer includes aluminum and the second metal layer includes at least one of titanium and tungsten.

16. The method of claim 13, wherein the first metal layer is deposited in a process chamber at a first power level and wherein the cooling step is carried out at a second power level that is less than the first power level.

17. The method of claim 16, wherein the second power level is substantially equal to zero.

18. A stacked structure including at least a metallization layer and an overlying anti-reflective coating, produced by carrying out the steps of:
   depositing the metallization layer on a substrate;
   cooling the metallization layer for at least 30 seconds; and
   depositing the anti-reflective coating on the cooled metallization layer.

19. The stacked structure of claim 18, wherein the metallization layer includes at least one metal suitable to form an electrical interconnect and the anti-reflective layer includes at least one refractory metal.

* * * * *